United States Patent
Visweswaran et al.

(10) Patent No.: US 9,444,433 B2
(45) Date of Patent: Sep. 13, 2016

(54) WIDEBAND FM DEMODULATION BY INJECTION-LOCKED DIVISION OF FREQUENCY DEVIATION

(71) Applicant: Technische Universiteit Delft, Delft (NL)

(72) Inventors: Akshay Visweswaran, Delft (NL); John Robert Long, Delft (NL); Robert Bogdan Staszewski, Delft (NL)

(73) Assignee: Technische Universiteit Delft, Delft (NL)

( * ) Notice: Subject to any disclaimer, the term of this patent is extended or adjusted under 35 U.S.C. 154(b) by 153 days.

(21) Appl. No.: 14/247,534

(22) Filed: Apr. 8, 2014

(65) Prior Publication Data

US 2014/0355720 A1    Dec. 4, 2014

Related U.S. Application Data

(60) Provisional application No. 61/829,976, filed on May 31, 2013.

(51) Int. Cl.
*H03H 15/00* (2006.01)
*H03D 3/00* (2006.01)
*H04B 1/16* (2006.01)

(52) U.S. Cl.
CPC ............. *H03H 15/00* (2013.01); *H03D 3/007* (2013.01); *H04B 1/16* (2013.01)

(58) Field of Classification Search
CPC ........... H03D 3/007; H03D 3/00; H04B 1/16
USPC .................. 329/315, 316, 234, 325; 331/57; 375/324
See application file for complete search history.

(56) References Cited

U.S. PATENT DOCUMENTS

| | | | | |
|---|---|---|---|---|
| 5,650,749 | A * | 7/1997 | Main ...................... | H03D 3/24 329/324 |
| 6,535,037 | B2 * | 3/2003 | Maligeorgos .......... | H03B 19/14 327/116 |
| 7,312,669 | B2 * | 12/2007 | Kinoshita ............ | H03K 3/0322 331/12 |
| 2002/0094037 | A1* | 7/2002 | Darabi .................. | H04L 25/062 375/316 |
| 2009/0086871 | A1* | 4/2009 | Casper ............. | G01R 31/31726 375/371 |

OTHER PUBLICATIONS

A. Natarajan et al., "A Fully-Integrated 16- Element Phased-Array Receiver in SiGe BiCMOS for 60GHz Communications," IEEE J. Solid-State Cir, vol. 46, No. 5, pp. 1059-1075, May 2005.
A. Parsa, B. Razavi, "A 60GHz Receiver Using a 30GHz LO," ISSCC Dig. Tech. Papers, pp. 190-191, 606, Feb. 2008.
S. Emami et al., "A Highly Integrated 60GHz CMOS Front-End Receiver," ISSCC Dig. Tech. Papers, pp. 190-191, Feb. 2007.

(Continued)

*Primary Examiner* — Jeffrey Shin
(74) *Attorney, Agent, or Firm* — Zaretsky Group PC; Howard Zaretsky

(57) ABSTRACT

A novel and useful wideband FM demodulator operating across an 8 GHz IF bandwidth for application in low-power, wideband heterodyne receivers. The demodulator includes an n-stage ring oscillator that is injection locked to a wideband input signal. Locking to the input frequency, it divides the FM deviation by n, thereby facilitating as well as reducing the energy required for wideband demodulation. The quadrature-phased output of the ring oscillator is phase correlated using a low-power folded CMOS mixer capable of detecting FM up to 400 Mb/s over a 2-10 GHz IF frequency range.

32 Claims, 10 Drawing Sheets

(56) References Cited

OTHER PUBLICATIONS

S.D. Toso, A. Bevilacqua, M. Tiebout, "A 0.06 mm 11 mW Local Oscillator for the GSM Standard in 65 nm CMOS," IEEE J. Solid-State Cir, vol. 45, No. 7, pp. 1295-1304, Jul. 2010.

C.L. Ruthroff, "Injection-Locked-Oscillator F.M. Receiver Analysis," B.S.T Journal., pp. 1653-1661, Oct. 1968.

John F.M. Gerrits et al., "Principles and Limitations of Ultra-Wideband FM Communications Systems," EURASIP Journal on Applied Signal Processing, pp. 382-396, 2005.

S-H. Wen, et al., "A Low power 20 GHz 1.5 Gb/s CMOS Injection-Pulling FSK Modulator and Frequency Discriminator for 60GHz Links," IEEE CICC, pp. 483-486, Sep. 2008.

N. Saputra, J.R. Long, "A Short-Range Low Data-Rate Regenerative FM-UWB Receiver," IEEE Trans on Microwave Theory and Techniques, vol. 59, No. 4,pp. 1131-1140, Apr. 2011.

G. Papotto et al., "A 90nm CMOS 5Mb/s Crystal-Less RF Transceiver for RF-Powered WSN Nodes," ISSCC Dig. Tech. Papers, pp. 452-453, Feb. 2012.

* cited by examiner

WIDEBAND FM DEMODULATION BY INJECTION-LOCKED DIVISION OF FREQUENCY DEVIATION

REFERENCE TO PRIORITY APPLICATION

This application claims priority to U.S. Provisional Application Ser. No. 61/829,976, filed May 31, 2013, entitled "Time Domain RF Signal Processing," incorporated herein by reference in its entirety.

FIELD OF THE INVENTION

The present invention relates to the field of semiconductor integrated circuits and more particularly relates a wideband Intermediate Frequency (IF) FM demodulator incorporating an injection locking ring oscillator circuit.

BACKGROUND OF THE INVENTION

In the field of radio receivers, portable or mobile receivers for low-cost, high-speed data links ideally should be compact, fully-integrated and consume minimal DC power. Simple modulation schemes, such as wideband FSK, are currently of interest for wireless local and personal area communication, where low-complexity receivers capable of robust data transfers at rates up to 1 Gbit/s are required. Down-conversion and demodulation of data streams on the order of Gbit/s at baseband frequencies has proven difficult with conventional circuit techniques within a reasonable power constraint. Demodulation at IF, using a heterodyne approach, simplifies the implementation of a wideband receiver, thereby saving power and chip area. Low-complexity prior art FM receivers are efficient and compact when processing data rates on the order of 100 kbps. Their wideband performance for data rates approaching 1 Gbit/s, however, is limited, as the power consumption increases in proportion to the increase in data rate.

There is thus a need for a low power FM demodulator that is able to operate across a relatively wide frequency band, and more particularly, operate over a wide fractional bandwidth $f_c/\Delta f$. The FM demodulator is preferably low cost, able to be constructed using commonly available semiconductor manufacturing processes and able to be integrated into a wide variety of system designs. In addition, the circuit should be able to accept a wideband input signal on the order of 2 to 10 GHz, have a fractional bandwidth greater than one and generate a demodulated output signal while minimizing power dissipation.

SUMMARY OF THE INVENTION

A novel and useful wideband FM demodulator operating across an 8 GHz IF bandwidth for application in low-power, wideband heterodyne receivers. The demodulator includes an n-stage ring oscillator that is frequency modulated by a wideband input signal. Locking to $(1/n)^{th}$ the input frequency, it divides the FM deviation by n, thereby reducing the energy required for wideband demodulation. The quadrature-phased output of the ring oscillator is phase correlated using a low-power folded CMOS mixer capable of detecting FM up to 400 Mb/s over a 2 to 10 GHz IF frequency range.

An example embodiment describes an FM demodulator in which a four-stage ring oscillator is frequency modulated by a wideband input, locking it to $1/4^{th}$ the input frequency. The locked-in oscillator reduces the FM deviation by a factor of four and provides convenient quadrature outputs over a wide bandwidth. The quadrature outputs are input to a folded CMOS autocorrelation mixer for coherent FM demodulation. The FM demodulator is applicable, for example, for use in multi-GHz IF low-power demodulators for wideband heterodyne receivers. Measurements at 4 Mbit/s data rate demonstrate demodulator operation from 2 to 10 GHz, i.e. a fractional bandwidth of 1.34, at a power consumption of 0.75 nJ/bit.

There is thus provided in accordance with the invention, an FM demodulator circuit for demodulating a wideband FM signal with a high fractional bandwidth comprising an injection-locked ring oscillator operative to receive a wideband input signal and provide division of frequency deviation thereof and a mixer operative to receive the output of the ring oscillator and to generate a demodulated output signal therefrom.

There is also provided in accordance with the invention, an FM demodulator circuit for demodulating a wideband FM signal with a high fractional bandwidth comprising an injection-locked ring oscillator operative to receive a wideband input signal and generate quadrature-phased outputs therefrom and an autocorrelation mixer operative to perform phase correlation of the quadrature-phased output of the ring oscillator and to generate a demodulated output signal therefrom.

There is further provided in accordance with the invention, an FM demodulator circuit for demodulating a wideband FM signal with a high fractional bandwidth comprising an injection-locked ring oscillator operative to receive a wideband input signal and generate quadrature-phased outputs therefrom, a first mixer operative to perform demodulation of the quadrature-phased output of the ring oscillator and to generate a first intermediate demodulated signal therefrom, a first gain stage operative to amplify and filter the first intermediate demodulated signal, a second autocorrelation mixer operative to perform demodulation of the output of the first gain stage to generate a second intermediate demodulated output signal therefrom and a second gain stage operative to amplify and filter the second intermediate demodulated output signal to generate a demodulated output signal therefrom.

There is also provided in accordance with the invention, a method of FM demodulation, the method comprising injection-locking a ring oscillator adapted to receive a wideband input signal to generate quadrature-phased outputs therefrom and performing phase correlation of the quadrature-phased output of the ring oscillator and generating a demodulated output signal therefrom.

There is further provided in accordance with the invention, an RF receiver comprising a low noise amplifier operative to receive a signal from an antenna coupled thereto, a first mixer operative to generate an IF signal based on a received signal and a local oscillator signal, an IF filter operative to filter the IF signal, an IF amplifier operative to amplify the filtered IF signal and an FM demodulator circuit for demodulating a wideband FM signal with a high fractional bandwidth comprising an injection-locked ring oscillator operative to receive the amplified IF signal, provide division of frequency deviation thereof and generate quadrature-phased outputs therefrom and a second mixer configured to perform phase correlation of the quadrature-phased output of the ring oscillator and to generate a demodulated output signal therefrom.

BRIEF DESCRIPTION OF THE DRAWINGS

The invention is herein described, by way of example only, with reference to the accompanying drawings, wherein.

DETAILED DESCRIPTION OF THE INVENTION

The present invention is a wideband, low power FM demodulator and related receiver circuit. The FM demodulator is based on a novel use of injection locking for division of multi-GHz FM deviation and wideband quadrature generation that operates across a frequency range of 2 to 10 GHz and in one embodiment, with a fractional bandwidth ratio $\Delta f/fc=1.4$, while consuming 0.75 nJ/bit at 4 Mbps data rate. Simulations performed by the inventors predict that the circuit is capable of demodulating data at rates up to 400 Mb/s (i.e. 7.5 pJ/bit). In one embodiment, the total power consumption of the demodulator is 3 mW from a 1.2 V supply.

The integrated frequency/phase demodulator of the present invention is capable of operating over a fractional bandwidth $\Delta f/fc$ greater than one and has been implemented in silicon and is capable of division of FM deviation and multi-GHz IF low-power demodulation.

Figure 1:
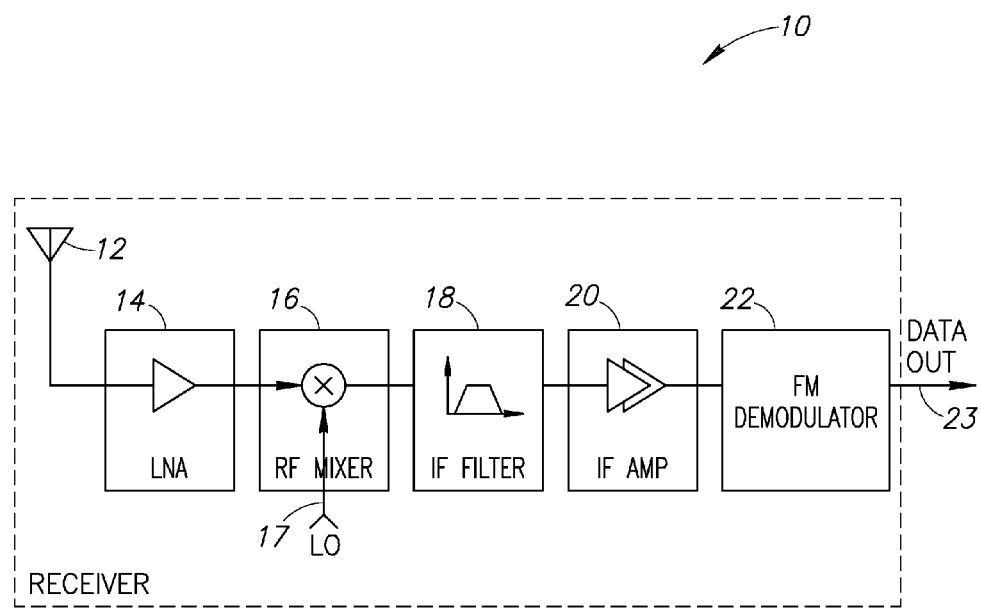
FIG. 1 is a high level block diagram illustrating an example heterodyne receiver with demodulation at IF.

A high level block diagram illustrating an example heterodyne receiver with demodulation at IF is shown in FIG. 1. The receiver circuit, generally referenced 10, comprises antenna 12 coupled to a low noise amplifier (LNA) 14. The received signal output of the LNA is mixed with a local oscillator (LO) signal 17 to yield an IF signal. The IF signal is filtered by IF filter block 18 and amplified by IP amplifier block 20 before being input to FM demodulator block 22 which generates output data 23.

In one embodiment of the invention, a ring oscillator is used to perform frequency division when injection locked. Multiphase injection is used to widen the locking range of the frequency dividers in a ring oscillator. In one embodiment, a 4-stage oscillator is used which requires anti-phased signals. Such a circuit has the benefit of fitting seamlessly into differential circuit chains. The embodiments of the invention presented herein are inherently compact inductorless implementations which can be used for quadrature-phased LO division and can even operate over two frequency octaves in the low GHz region. When driven by a wideband FM signal, the injection-locked oscillator behaves essentially like an adaptive filter, tracking the frequency having maximum power. The invention takes advantage of the ability of this circuit to lock to FM signals and divide the input signal bandwidth. This circuit technique is exploited to achieve superior wideband demodulation performance.

Injection locking effectively creates a bandpass filter for signal and noise and can work at input SNR values approaching approximately 0 dB. It is important to note that while the locked oscillator reduces FM deviation by virtue of division, the modulating frequency remains unaltered. The operating bandwidth is reduced by the division factor (e.g., four), which appreciably eases the bandwidth/power consumption trade-off in following stages. Quadrature phases inherent in the ring topology can be multiplied, and subsequently low pass filtered, to perform demodulation based on phase correlation. This avoids the need for wideband phase shifters and complex frequency plans for I/Q generation.

The benefits of this injection locking approach to demodulation include: (1) insensitivity to noise (since noise is uncorrelated); (2) the ability to demodulate a wideband FM signal with a high fractional bandwidth; (3) significant reduction in power consumption by reducing the absolute bandwidth of operation thereby breaking the classical trade-off between power consumption and bandwidth; (4) power consumption is independent of data rate since the power consumption of the oscillator does not vary and it is able to lock to (and subsequently allow demodulation of) high and low data rate signals; (5) convenient wideband quadrature phase signals that reduce complexity, chip area and power consumption; (6) the circuit does not impose a harmonic distortion requirement on the preceding IF amplifier; (7) utilizes a folded CMOS mixer that allows for bias control for low $V_{dd}$ (e.g., 1.2V) operation and allows the mixer quad to operate with close to zero bias current; (8) non-susceptibility to AM; and (9) inductorless circuit design reduces required chip area The high input drive required for injection locking, however, and its susceptibility to interferers are both addressed by the invention. In one embodiment, both these problems are alleviated by applying the injection locking phase correlation technique at IF rather than RF, where potential blockers can be filtered by the preceding stages. The design of the wideband IF amplifier is necessary for signal gain, while the impact of interferers is substantially reduced by the directivity of mm-wave antennas.

Figure 2A:
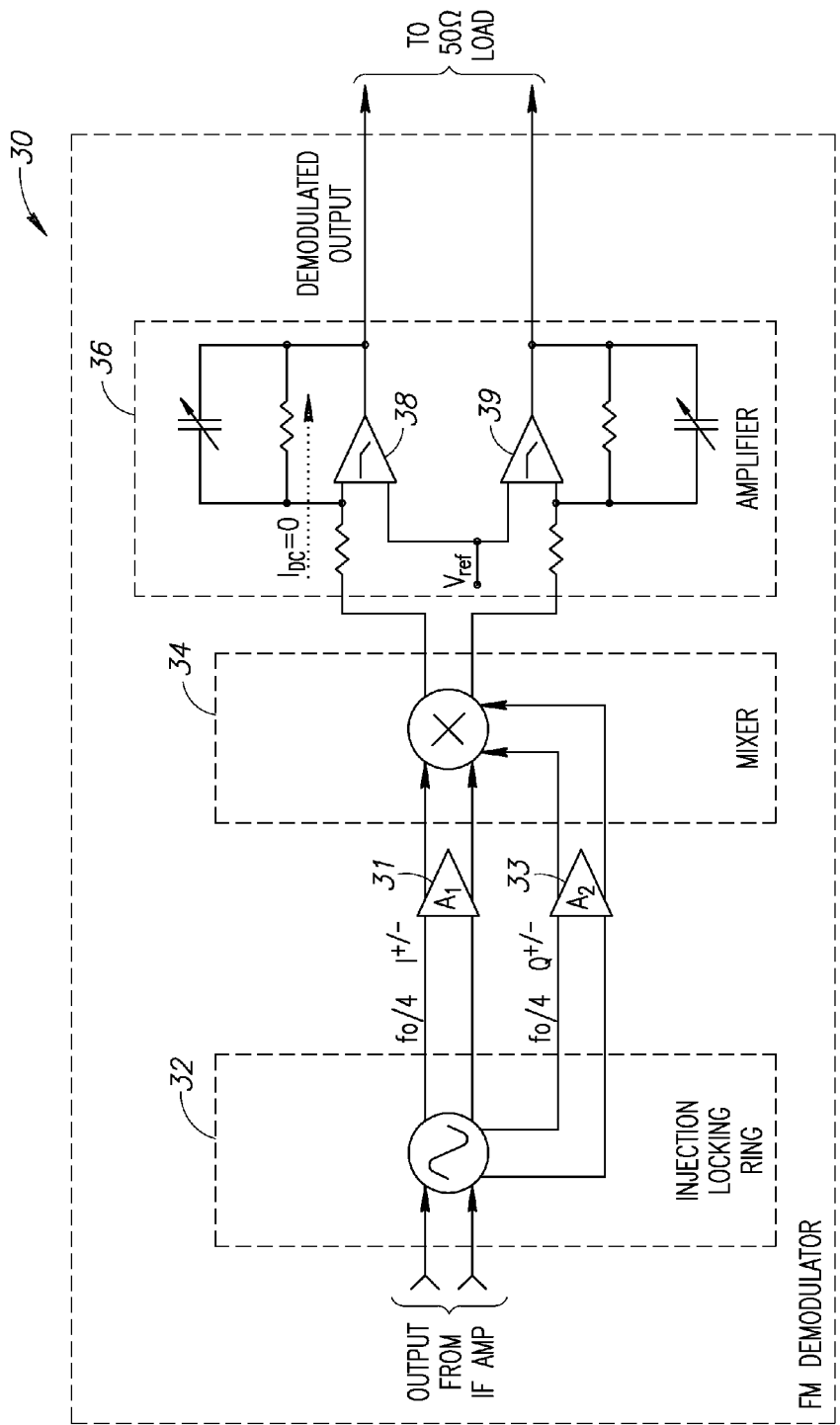
FIG. 2A is a block diagram illustrating a first example wideband injection-locking IF demodulator of the present invention.

A block diagram illustrating a first example wideband injection-locking IF FM demodulator of the present invention is shown in FIG. 2A. The IF demodulator circuit, generally referenced 30, is suitable for use in heterodyne receiver applications. The FM demodulator 30 comprises injection locking ring 32, I and Q amplifiers 31, 33, autocorrelation mixer 34 and amplifier 36. Quadrature outputs from the injection-locked input stage 32 are interfaced through buffers $A_1$ 31 and $A_2$ 33 to the autocorrelation mixer 34. The power consumption of the interface buffers and mixer are reduced considerably by the rail-to-rail output provided by the ring oscillator, and reduction of the input bandwidth by FM division. The low frequency demodulated output from the mixer is buffered for 50Ω measurement using class AB operational amplifiers 38, 39 in shunt feedback configuration. The ratio of the feedback and input resistances in the amplifier circuit 36 sets the voltage gain (e.g., 6 in this example embodiment), while the common mode output of the mixer and amplifier is set to $V_{DD}/2$ using $V_{ref}$, thereby ensuring DC isolation.

Figures 2B, 2C:
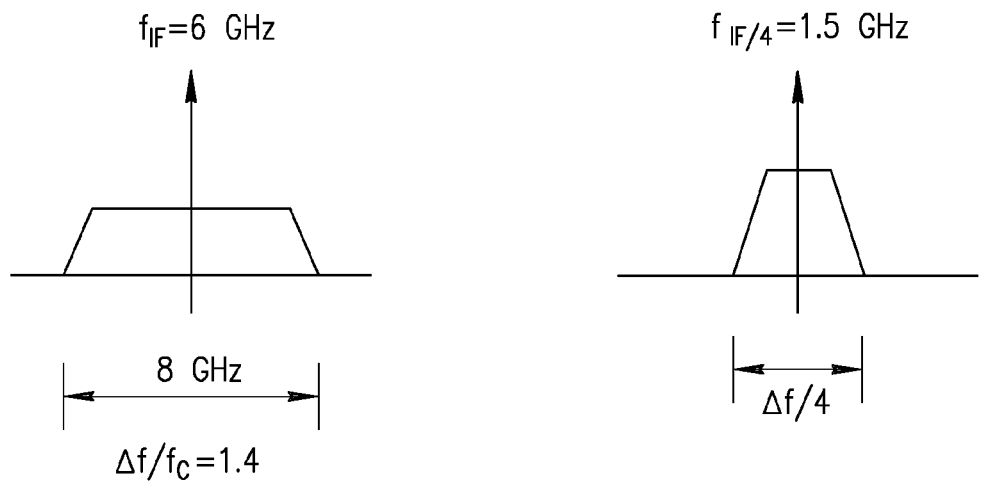
FIG. 2B is a diagram illustrating example wideband input signal and fractional bandwidth.
FIG. 2C is a diagram illustrating example signal output of the ring oscillator.

A diagram illustrating example wideband input signal and fractional bandwidth is shown in FIG. 2B. The IF frequency in this example is 6 GHz while the bandwidth of the signal of the IF amplifier is 8 GHz. The fractional bandwidth ratio Δf/fc in this example is 1.4. A diagram illustrating example signal output of the ring oscillator 32 is shown in FIG. 2C. At the output of the ring oscillator in this example embodiment, the IF frequency is divided by four (i.e. 1.5 GHz). The frequency deviation is divided by four as well.

Figure 2D:
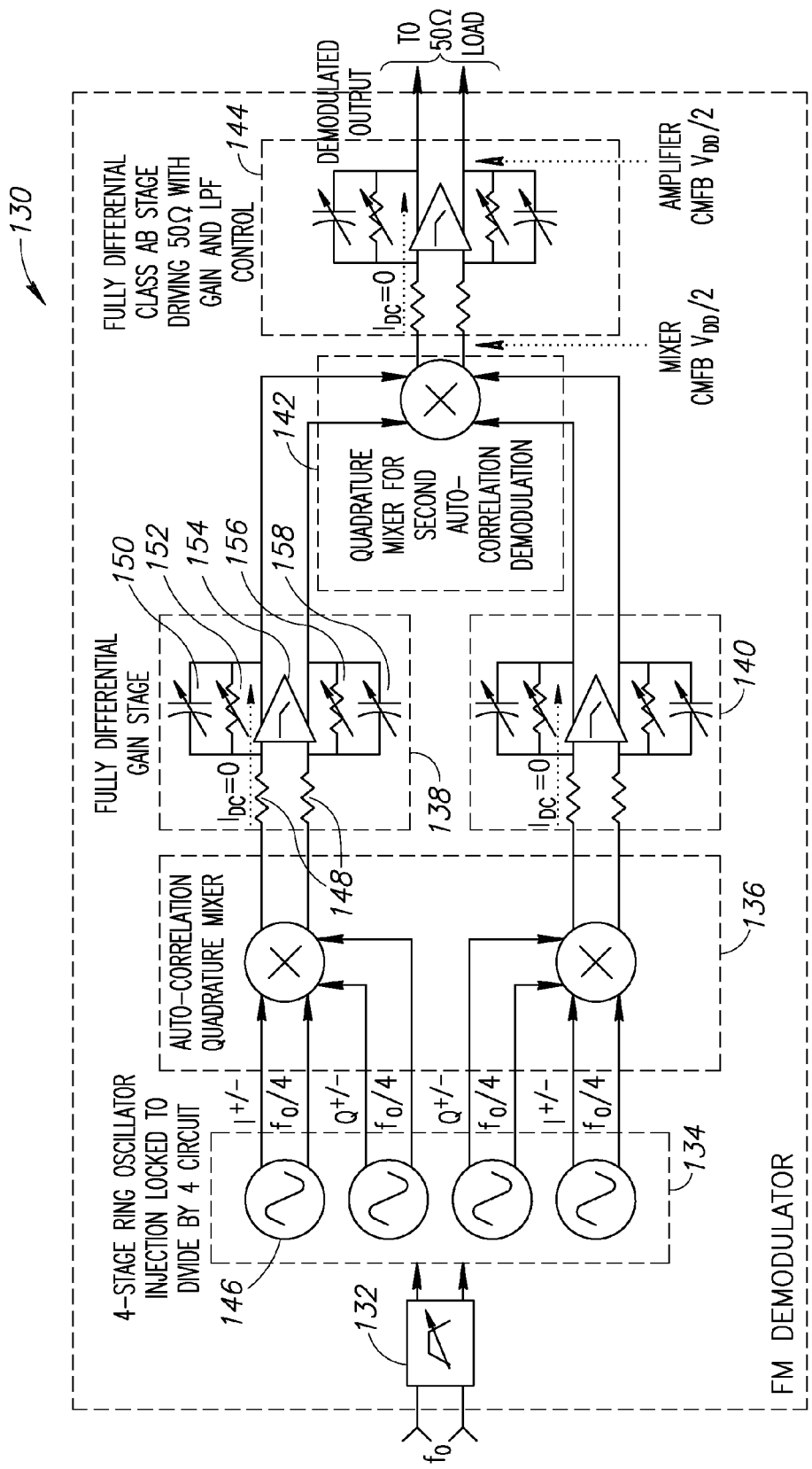
FIG. 2D is a block diagram illustrating a second example wideband injection-locking IF demodulator of the present invention.

A block diagram illustrating a second example wideband injection-locking IF demodulator of the present invention is shown in FIG. 2D. The FM demodulator circuit, generally referenced 130, comprises an input bandpass filter 132, four stage ring oscillator 146, quadrature mixer 136, fully differential amplifier stages 138, 140, quadrature mixer for second demodulation 142 and differential buffer/amplifier circuit 144.

Figure 3:
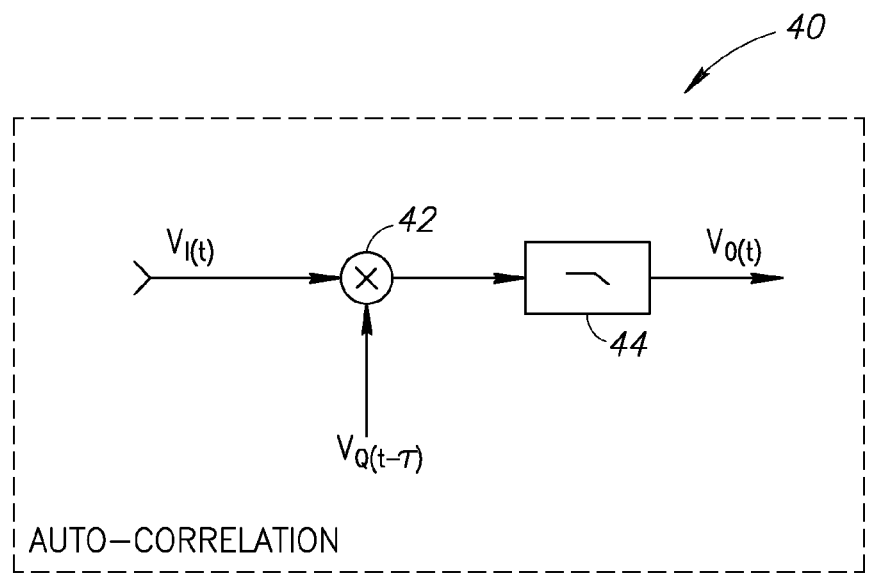
FIG. 3 is a block diagram illustrating an example autocorrelation mixer of the present invention.

A block diagram illustrating an example autocorrelation mixer of the present invention is shown in FIG. 3. The autocorrelation mixer 40 comprises a multiplier circuit 42 adapted to receive the compressed I and Q input signals generated by the ring oscillator. The output of the mixer is low pass filtered using filter 44. It is important to note that the original modulated information carried by the input signal is not effected by the phase correlation process, which is shown mathematically below.

An FM signal passed through a frequency divider of factor 'n' can be expressed as shown below.

$$V_{FM\_in}(t) = X_{C0}\cos[\omega_C t + \beta\cos(\omega_m t)] \quad (1)$$

$$V_{FM\_out}(t) = X_C\cos\left[\frac{\omega_C}{n}t + \frac{\beta}{n}\cos(\omega_m t)\right] \quad (2)$$

$$\beta = \frac{\Delta\omega}{\omega_m}, D = \frac{\Delta\omega}{\omega_C} \quad (3)$$

Where $V_{FM\_in}$ is the general form of an FM signal locking the ring oscillator.

$X_{C0}$ is the amplitude.

$\omega_C$ is the carrier frequency.

$\beta$ is the modulation index of the signal before division.

$\omega_m$ is the original data (i.e. the modulating frequency in radians/s).

$V_{FM\_out}$ is the output coming after running $V_{FM\_in}$ through the injection locking divider.

Note that the FM deviation (Δω) is scaled by a factor 'n'. It can also be seen that the modulation index (β) is also scaled by 'n'.

The 4-stage injection locked ring oscillator produces two sets of quadrature phase signals. Two of which can be used for phase correlation. These are written as shown below:

$$V_{Fm\_I}(t) = X_C\cos\left[\frac{\omega_C}{n}t + \frac{\beta}{n}\cos(\omega_m t)\right] \quad (4)$$

-continued $$V_{Fm\_Q}(t) = X_C\cos\left[\frac{\omega_C}{n}(t-\tau) + \frac{\beta}{n}\cos(\omega_m(t-\tau))\right] \quad (5)$$

Where $V_{FM\_I}$ and $V_{FM\_Q}$ are the quadrature phased I and Q FM signals with divided frequency deviation.

τ corresponds to a delay of 90 degrees and is T/4 or $$\frac{\pi}{2\omega_i}.$$

The autocorrelator 34 (FIG. 2A) functions to multiply and low-pass filter the signals $V_{FM\_I}$ and $V_{FM\_Q}$. The corresponding demodulated output takes the following form:

$$\lim_{\tau \to 0} V_o(t) = \frac{X_C^2}{2}\sin\left[\left(\frac{\pi\Delta\omega}{2\omega_C}\right)\sin(\omega_m t)\right] \quad (6)$$

Where $V_o(t)$ is the demodulated output signal.

The expression for the demodulated output is that of classical FM demodulation, and it is important to note that the data signal (w) is retained after division of frequency deviation through injection-locking. This method further reduces distortion and enables wideband demodulation, which otherwise is not feasible.

The first 'sin' term expression above $$\frac{\pi\Delta\omega}{2\omega_C}$$

is a fixed term. The second 'sin' term $\omega_m t$ includes the original modulated data $\omega_m$.

Figure 4:
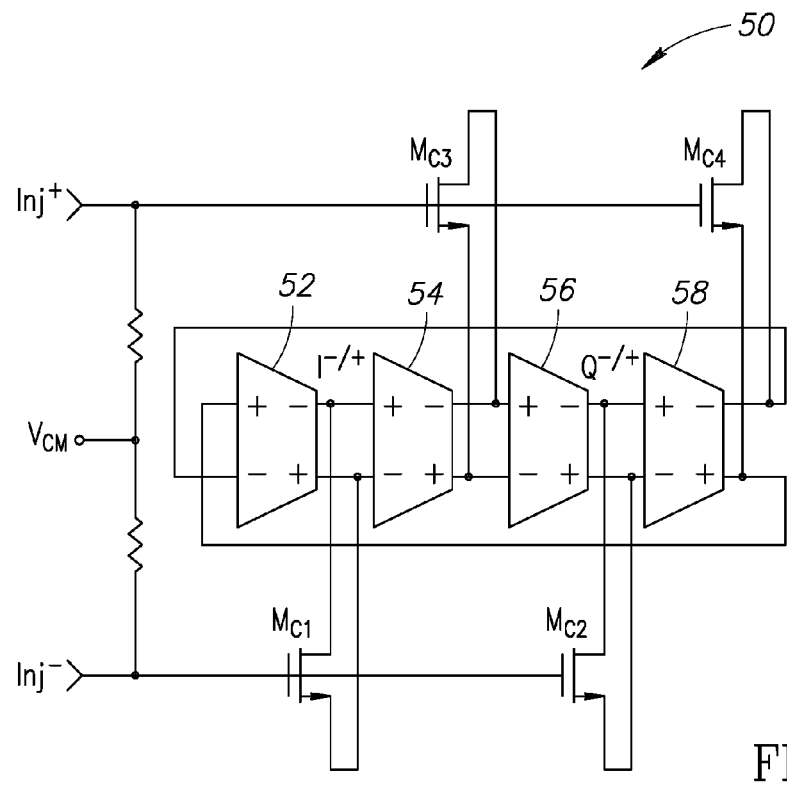
FIG. 4 is a schematic diagram illustrating an example injection locked ring oscillator.

The circuit design aspects of the building blocks of the FM demodulator shown in FIGS. 2A and 2D will now be described in more detail. A schematic diagram illustrating an example injection locked ring oscillator to perform frequency division is shown in FIG. 4. The injection locked ring oscillator, generally referenced 50, comprises core ring oscillator stages 52, 54, 56, 58, injection locking MOS transistors $M_{C1}$, $M_{C2}$, $M_{C3}$ and $M_{C4}$. Shown for illustration purposes only, the four-stage divide by four ring oscillator shown in FIG. 4 comprises the input stage of the FM demodulator. In one embodiment, it is differentially injection locked to the wideband input signal through switches $M_{C1-4}$. The use of differential injection locking serves to improve the injection locking range. The coupling transistors $M_{C1-4}$ are preferably configured for maximum gain to maximize the conversion of the input RF signal into current added into the ring oscillator. In addition, the biasing point of transistors $M_{C1}$, $M_{C2}$, $M_{C3}$ and $M_{C4}$ in one embodiment, is chosen to be 0.6V, which serves to improve locking performance. The biasing, however, can be varied to improve locking performance depending on the implementation.

Figure 5:
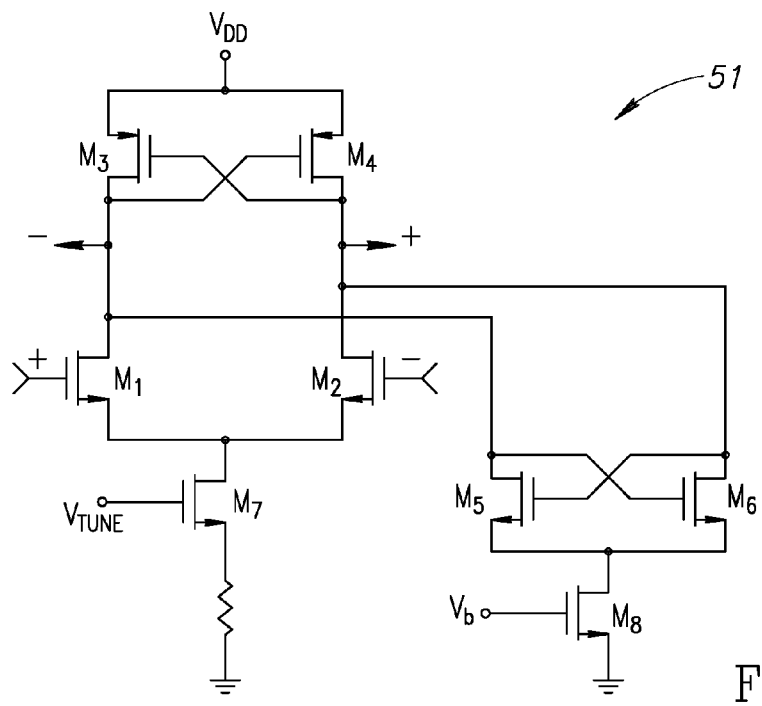
FIG. 5 is a schematic diagram illustrating an example circuit implementation of each stage of the ring oscillator of FIG. 4.

In one embodiment, each stage of the ring comprises a differential (highly non-linear) amplifier with a cross coupled PMOS load as shown in FIG. 5. Each stage of the ring oscillator, generally referenced 51, comprises MOS transistors $M_1$, $M_2$, $M_3$, $M_4$, $M_5$, $M_6$, $M_7$, $M_8$. The cross-coupled PMOS load provides local positive feedback and ensures that the outputs charge and discharge rapidly. The transistors are sized for (1) the operating, (2) frequency band, (3) minimum power consumption and (4) maximum locking range when operated from a 1.2V supply.

In this example embodiment, the dimensions of the transistors include $M_{3,4}$=[800 n/60 n]$_{x6}$; $M_{1,2}$=[800 n/60 n]$_{x6}$; $M_{5,6}$=[800 n/60 n]$_{x2}$; and $M_8$=[800 n/60 n]$_{x5}$. Cross-coupled NMOS transistors $M_{5,6}$ provide additional negative resistance in the event of startup failure, controlled by $V_b$. Coupling transistors $M_{C1-4}$ across the output of each stage are sized for maximum gain to enlarge the locking range, and therefore mitigate the impact of $V_b$ on the output frequency. Frequency tuning is implemented at the tail node, where $M_7$ is operated in triode configuration as a variable resistor controlled by $V_{TUNE}$.

Note that appending the ring oscillator delay cell with a tail current source functions to limit phase instability by limiting the available DC current. The ability to control the DC current enables the circuit to be configured to just marginally begin oscillations by meeting the well-known Barkhausen stability criterion for oscillation. This ensures that the self oscillation is not very strong and the circuit is therefore more responsive to an external locking signal.

Note further that additional start up control is provided as a backup measure in each ring oscillator cell (the NMOS transistor pair $M_5$ and $M_6$ in FIG. 5) in case there is not sufficient loop gain to start-up oscillations. Depending on the actual implementation of the circuit, this transistor may be optional.

The PMOS cross coupled load (PMOS transistor pair $M_3$ and $M_4$) adds local positive feedback which reduces the filtering property of the loop and ensures the outputs rise and fall quickly.

In this example embodiment, the oscillator has a 67% tuning range from 900 MHz to 1.8 GHz. The ring oscillator draws between 350 to 500 µA per stage, depending on $V_{TUNE}$. The DC voltage $V_{CM}$ ensures that transistors $M_{C1-4}$ remain in saturation (with respect to the amplitude driving their gate) in order to provide maximum gain. The optimal value of $V_{CM}$ cannot, however, be determined a priori and is therefore obtained iteratively. Frequency sensitivity is maximum at the oscillator's free running fo, but can also be controlled with $V_{CM}$. In this example, all measurements are made with $V_{CM}$ set to 0.6V. Adequate drive and bias at the input of MC1-4 further ensures that the oscillator does not fall out of lock, which would distort the demodulated waveform. The injection locking stage was also characterized as a stand-alone IC in order to ascertain its frequency response to wide-band signals. These data are presented and discussed infra.

In an FM signal, the modulating frequency ($f_m$) is typically orders of magnitude below the carrier, and does not affect the frequency tracking ability of the locked-in ring oscillator. It is noted that both $f_m$ and $\omega_m$ are used in this document to imply the same frequency quantity where the former in expressed in Hertz and the latter in radians/s. A data rate (i.e. twice $f_m$) limitation is imposed by the assumption that the carrier frequency is much higher than $f_m$ for a phase correlation demodulator. Simulations performed by the inventors suggest that the injection-locked demodulator of the present invention is capable of detecting FM signals coherently when the IF carrier is one order of magnitude higher than the modulating signal. This limits the maximum data rate to approximately 400 Mbps at the 2 GHz band edge, and greater than 1 Gbit/s between 8 and 10 GHz.

Figure 6:
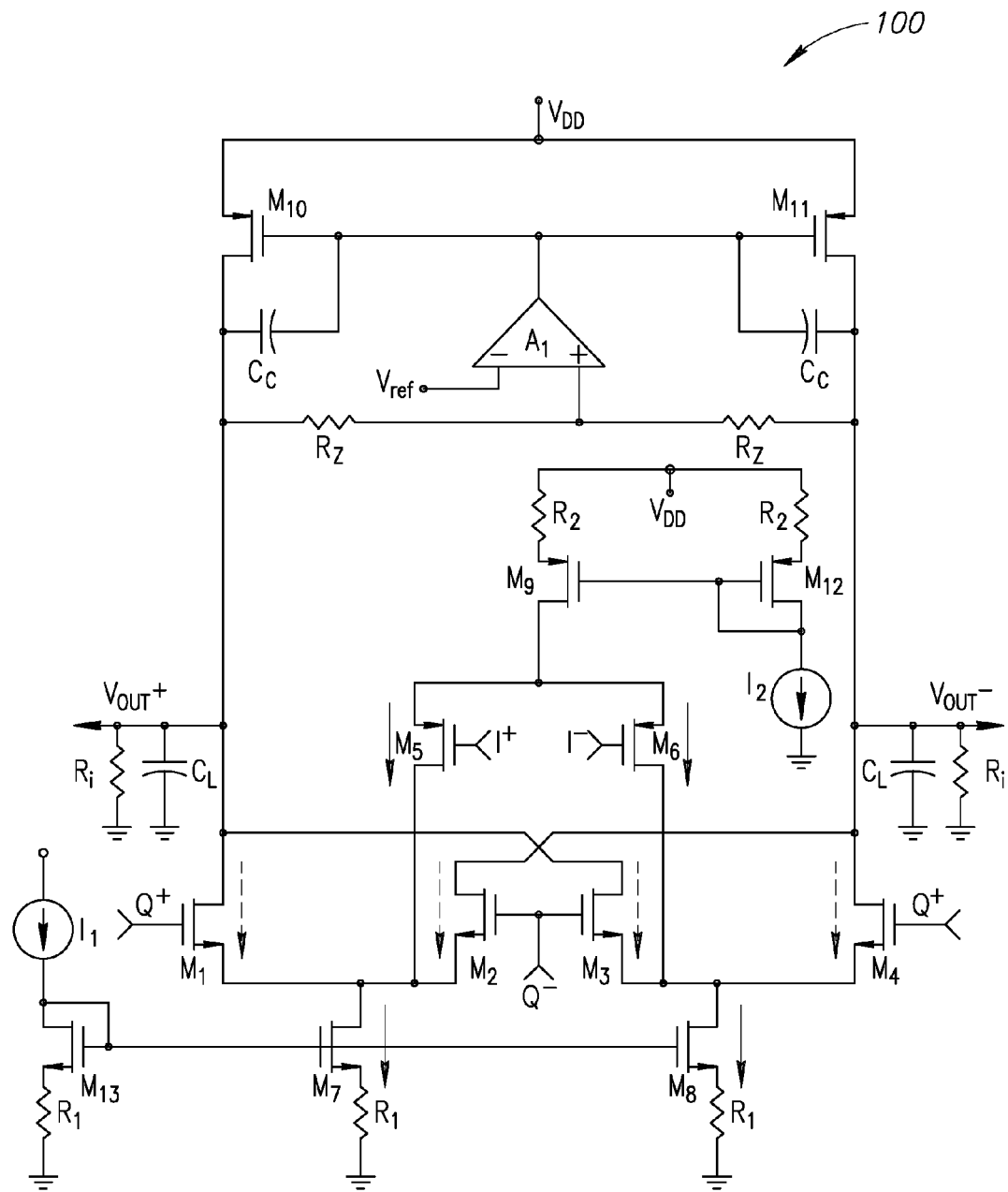
FIG. 6 is a diagram illustrating an example autocorrelation mixer circuit suitable for use with the present invention.

A diagram illustrating an example autocorrelation mixer circuit suitable for use with the present invention is shown in FIG. 6. The mixer circuit, generally referenced 100, comprises transistors $M_1$, $M_2$, $M_3$, $M_4$, $M_5$, $M_6$, $M_7$, $M_8$, $M_9$, $M_{10}$, $M_{11}$, $M_{12}$, $M_{12}$, amplifier $A_1$, resistors $R_1$, $R_2$, $R_c$, $R_i$, and capacitors $C_C$, $C_L$. In this example mixer, the maximum load capacitance $C_L$ is 80 pF maximum and $R_i$ is 30 kΩ.

In one example embodiment, the mixer circuit is constructed to comprise a folded mixer topology. It is common for mixers operating from low supply voltages to encounter headroom limitations and the tail current is often sacrificed at the expense of bias regulation and common-mode performance. To alleviate this, the mixer circuit 100 comprises complimentary transistors at its input ports. The switching quad comprises NMOS transistors $M_{1-4}$, while PMOS transistors $M_{5,6}$ form the RF port. In this embodiment, the PMOS device widths are twice that of the NMOS quad transistors to ensure equal loading in the I and Q paths. Current $I_2$ determines the current in $M_{5,6}$, while current I1 sets their difference to be equally distributed between $M_{1-4}$. In this manner, there is accurate control over the circuit's biasing.

The simulated common mode suppression from 0.5 to 2.5 GHz (i.e. the intended band of operation, since the 2-10 GHz IF input is divided by four by the injection locked oscillator (ILO) varies from 40-50 dB at either port. The mixer conversion gain is limited by the output impedance of tail current sources $M_{7,8,9}$, and a 75Ω degeneration resistance is employed at each source node to increase their respective output impedances. The injection-locked stage provides a rail-to-rail swing that allows the mixer to be constructed for low power consumption.

Measurements have been made with both $I_1$ and $I_2$ set to 150 µA. The output is set to 0.6V DC using common mode feedback (CMFB). The CMFB amplifier comprises an NMOS folded-cascode amplifier that consumes 30 µA. Compensation capacitance $C_C$ stabilizes the CMFB loop, for a maximum load capacitance of 80 pF. The mixer load is set by the input resistor $R_i$ of the feedback network of the output stage as shown in FIGS. 2A and 2D, and in this example embodiment is 30 kΩ. The minimum current in transistors $M_{1-4}$ to ensure a stable CMFB loop is 25 µA each.

Figure 7:
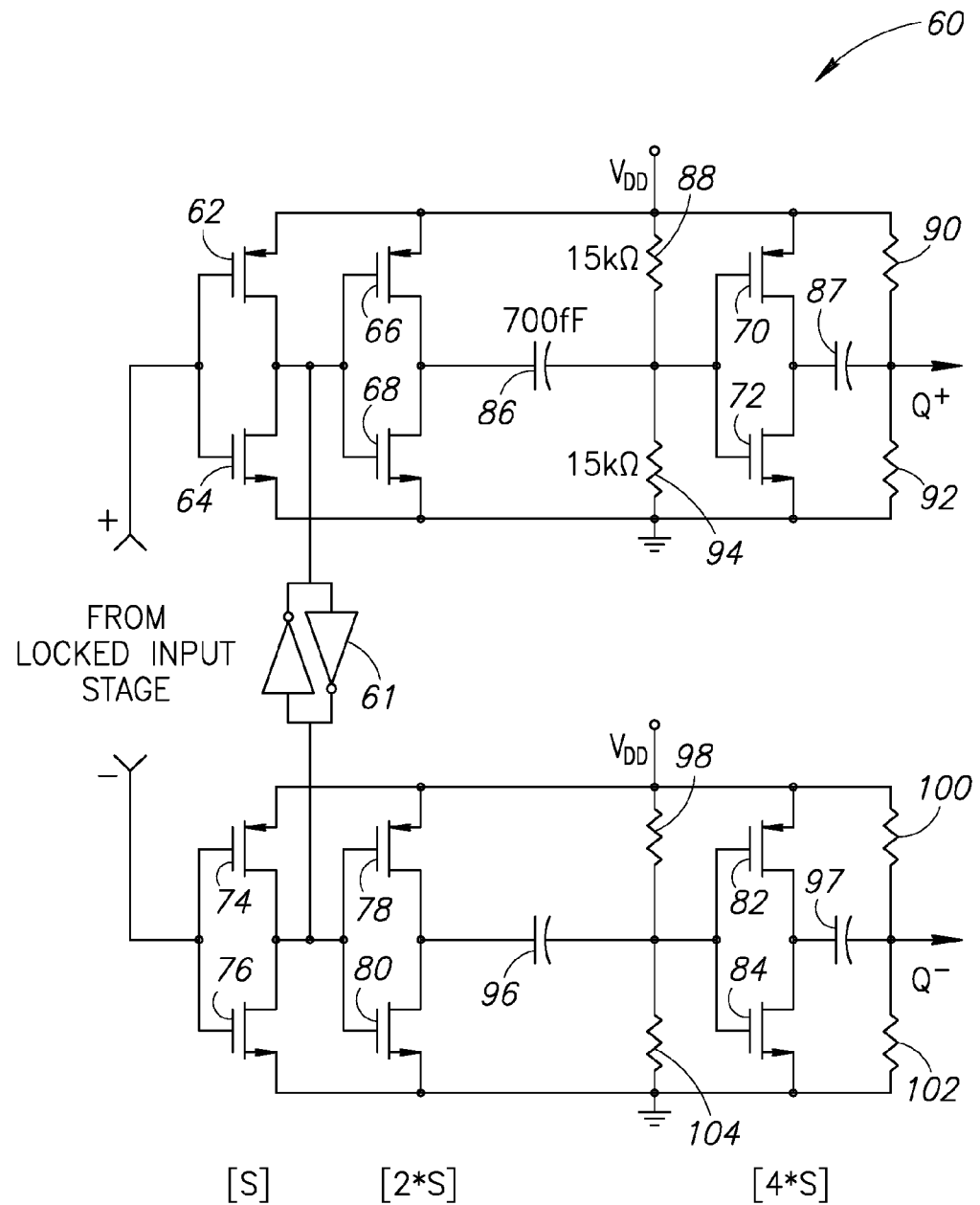
FIG. 7 is a schematic diagram illustrating an example interface buffer circuit suitable for use with the present invention.

Interface buffers $A_1$ 31 and $A_2$ 33 (FIG. 2A) between the oscillator output and the autocorrelation mixer are shown in more detail in FIG. 7. Note that only the Q path is shown for illustration purposes. Although not shown, an identical interface buffer is used for the I path. The interface buffer circuit, generally referenced 60, comprises transistors 62, 64, 66, 68, 70, 72, 74, 76, 78, 80, 82, 84, inverting buffers 61, resistors 88, 90, 92, 94, 98, 100, 102, 104 and capacitors 86, 87, 96, 97. The circuit comprises 3-inverter fan-out topology. Cross-coupled inverters between the differential paths function to preserve inverse phases, while the output DC level is set by a resistive divider (i.e. resistors 90/92 and 100/102).

The inter-stage network has a 40 MHz high-pass characteristic and does not attenuate the propagating signal. The output amplifiers in circuit 36 (FIG. 2A) and circuit 144 (FIG. 2D) provide low pass filtering in addition to the mixer load and can be made integral to the process of demodulation. Class AB operational amplifiers 38, 39 (FIG. 2A) drive the 50Ω load efficiently. In one embodiment, the amplifiers' quiescent current is 800 µA.

Figure 8:
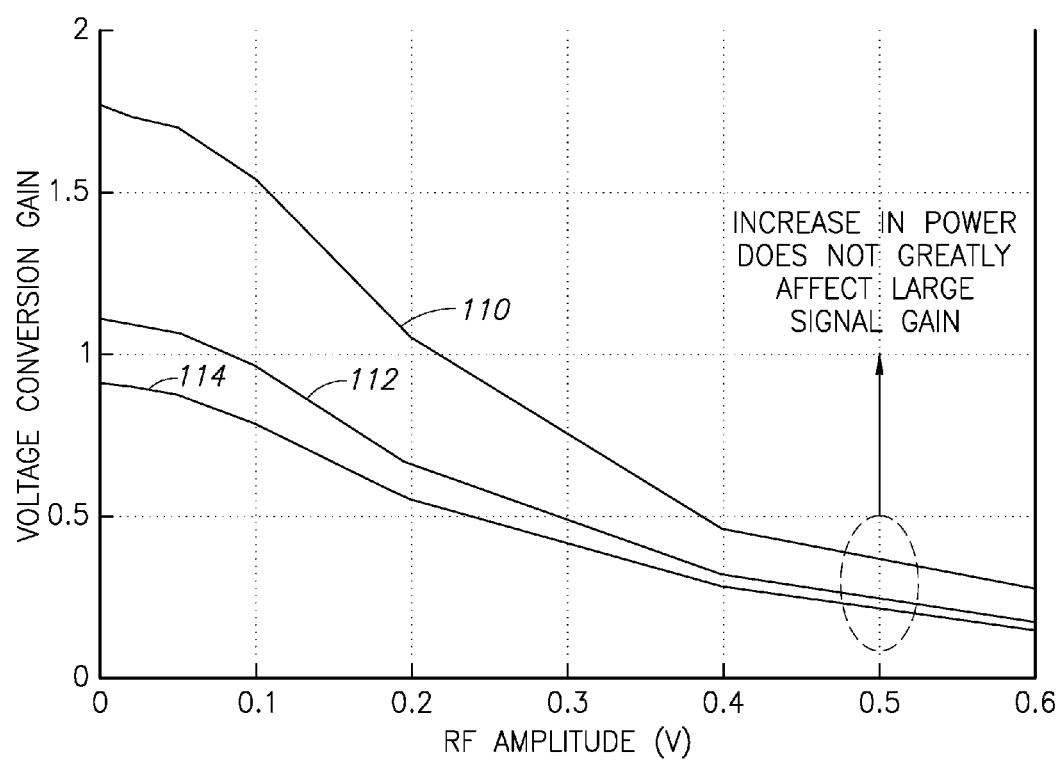
FIG. 8 is a graph illustrating voltage conversion gain as a function of RF amplitude.

A graph illustrating voltage conversion gain as a function of RF amplitude is shown in FIG. 8. As the graph indicates, conversion gain decreases with large RF signal input (i.e. I input to $M_5/M_6$ in the mixer circuit of FIG. 6; the Q input is the same). In addition, increasing power consumption does not have much impact on large signal conversion gain. Curve 110 represents the maximum current draw ($I_1$ and $I_2$ shown in FIG. 6); curve 112 represents the mid-level current draw; and curve 114 represents the minimum current draw. Thus, it is preferable to maintain the mixer at low power and obtain gain from the IF amplifier 20 (FIG. 1).

The demodulator of the present invention has been implemented in 65 nm CMOS technology. The core area comprises approximately 624×277 µm². In one embodiment, the free running oscillator has band edges of 900 MHz and 1.8 GHz. The measured tuning range is 67% around 1.35 GHz. The 2 to 10 GHz bandwidth has been measured in bands of 1 GHz. In one embodiment, testing was limited to 4 Mbps data rate (i.e. while the simulated data rate limit of the circuit is approximately 400 Mbps).

Figure 9:
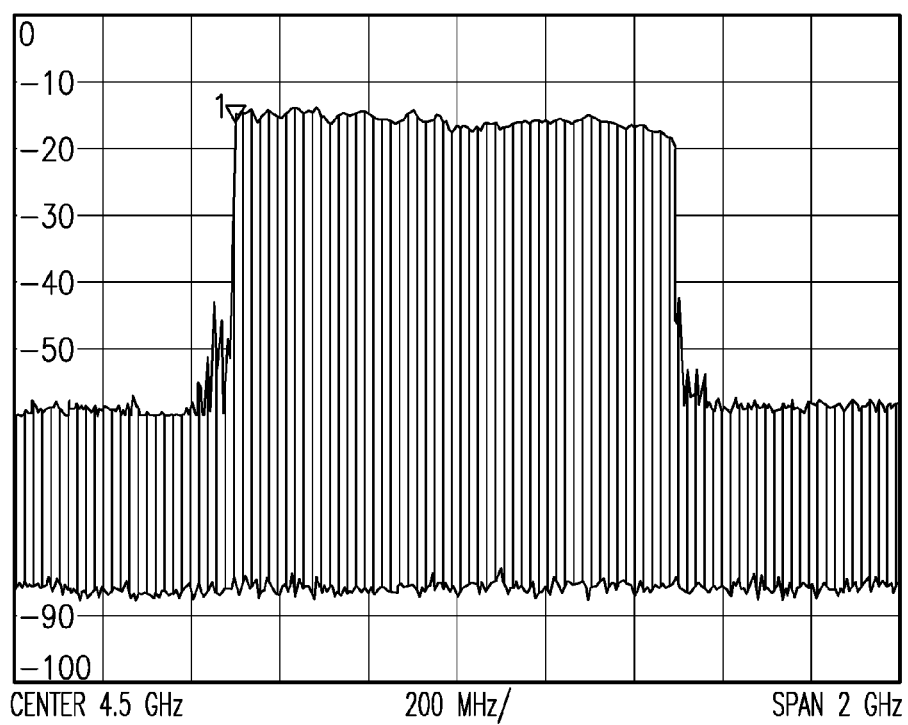
FIG. 9 is a graph illustrating the spectrum of an example input signal.
Figure 10:
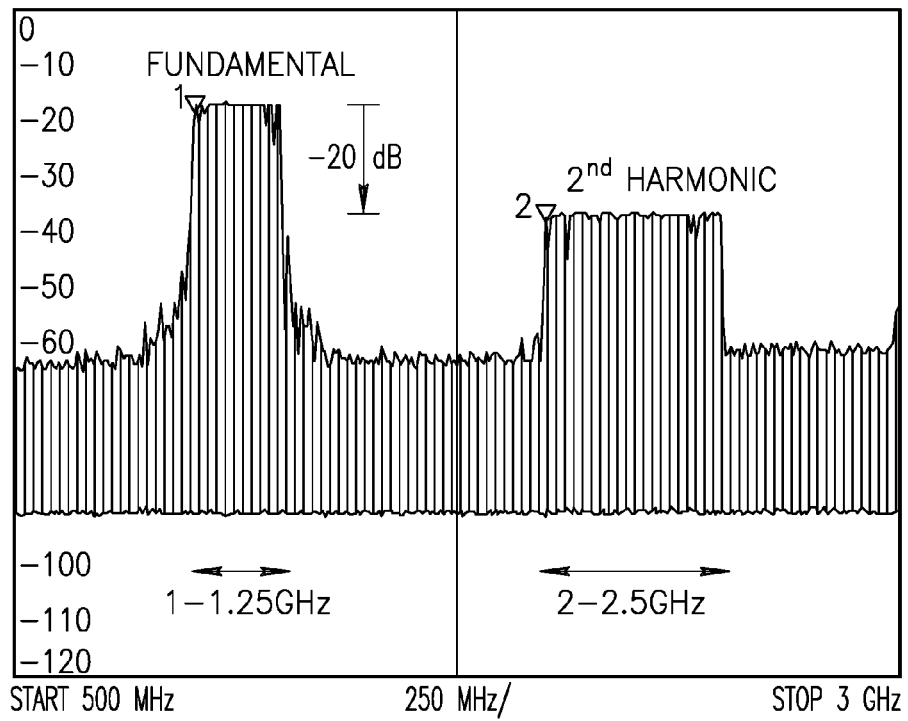
FIG. 10 is a graph illustrating the spectrum of the signal output from the injection locked ring oscillator stage.

A graph illustrating the spectrum of an example input signal is shown in FIG. 9. A graph illustrating the spectrum of the signal output from the injection locked ring oscillator stage is shown in FIG. 10. The graph in FIG. 9 shows division of the frequency spectrum at the middle of the band. A 1 GHz input signal (FIG. 9) is divided down by a factor of four, while retaining the modulating frequency. The 1 GHz bandwidth signal applied to the input gets divided down by a factor of four to 250 MHz as shown in FIG. 10. FIGS. 9 and 10 show the frequency responses at mid-band (i.e. 4 to 5 GHz). The output is single ended in both cases and the second harmonic suppression is approximately 20 dB that indicates that the oscillator is within its locking range. Locking limits are determined by the oscillator's $f_o$, and the amplitude driving transconductance stages $M_{C1-4}$.

Figure 11:
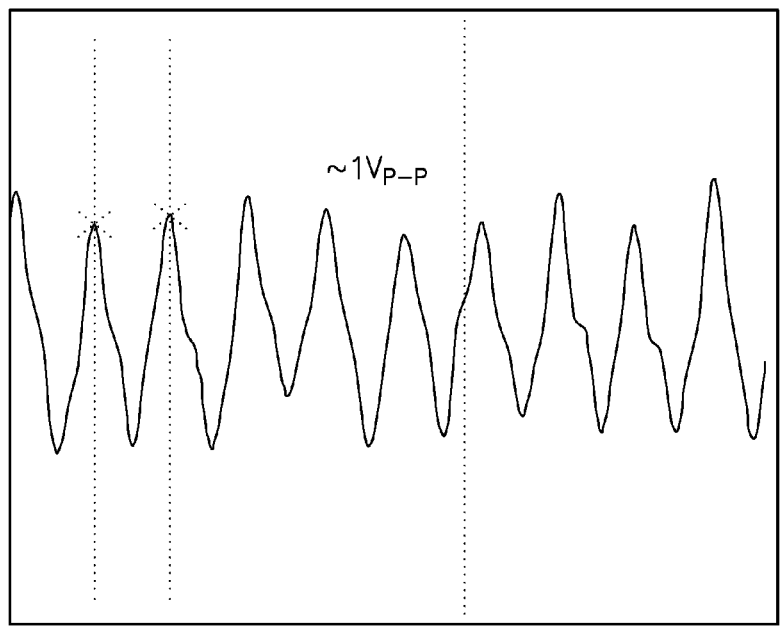
FIG. 11 is a graph illustrating an example demodulated 2 MHz triangular wave for a 7 to 8 GHz input.
Figure 12:
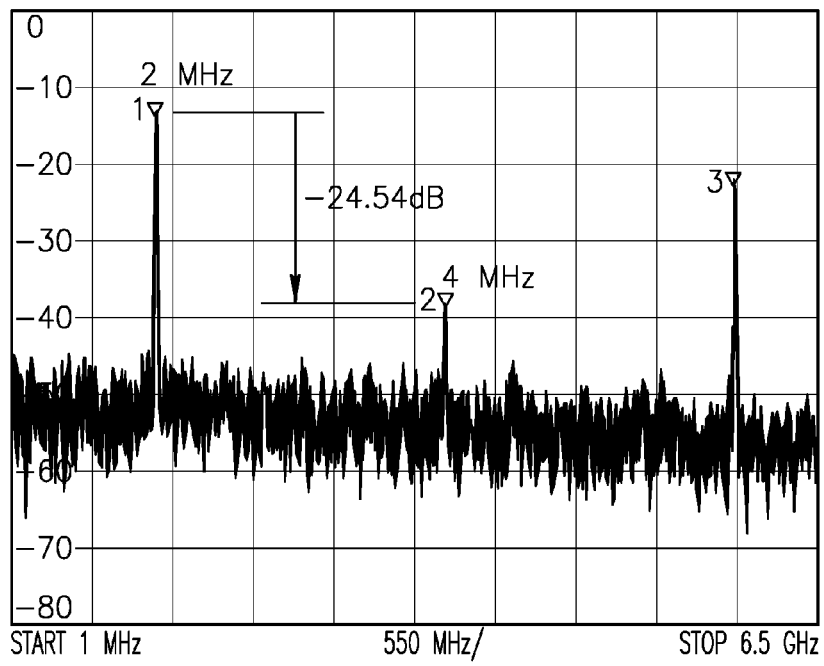
FIG. 12 is a graph illustrating the demodulated output spectrum of an example 7 to 8 GHz input signal modulated by a 2 MHz triangular signal.

A graph illustrating an example demodulated output 2 MHz triangular wave for a 7 to 8 GHz input is shown in FIG. 11. A graph illustrating the demodulated output spectrum of an example 7 to 8 GHz input signal modulated by a 2 MHz triangular signal is shown in FIG. 12. The input RF band in this case is at 7 to 8 GHz, $V_{CM}$ is 0.6 V and $f_o$ is 1.5 GHz. The modulating signal is set to 2 MHz, and a triangular wave is used to obtain a flat RF power spectrum. The demodulated waveform is a 2 MHz triangular wave, with the second harmonic component suppressed by approximately 24 dB, as shown in FIG. 12. The peak-to-peak swing is approximately 1 V.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

The corresponding structures, materials, acts and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application and to enable others of ordinary skill in the art to understand the invention for various embodiments with various modifications as are suited to the particular use contemplated.

What is claimed is:

1. An FM demodulator circuit for demodulating a wideband FM input signal with a high fractional bandwidth, comprising:
    an n-stage frequency dividing injection-locked ring oscillator operative to receive a wideband input signal and provide division of frequency deviation thereof, wherein n is an integer greater than one; and
    a mixer operative to receive the output of said ring oscillator and to generate a demodulated output signal therefrom.

2. The demodulator circuit according to claim 1, wherein n equals four resulting in a four stage divide by four ring oscillator operative to divide FM deviation by four.

3. The demodulator circuit according to claim 1, wherein each stage of said ring oscillator comprises a differential amplifier.

4. The demodulator circuit according to claim 1, wherein said ring oscillator generates quadrature outputs.

5. The demodulator circuit according to claim 4, wherein the modulating signal of the FM input remains unaltered while the operating bandwidth is reduced by a factor of n.

6. The demodulator circuit according to claim 1, wherein said mixer is configured as an autocorrelation mixer.

7. The demodulator circuit according to claim 1, wherein said mixer is constructed to have a common mode feedback (CMFB) folded CMOS configuration.

8. The demodulator circuit according to claim 1, wherein said injection-locked ring oscillator comprises a plurality of injection-locked ring oscillators.

9. The demodulator circuit according to claim 1, wherein said mixer comprises a plurality of mixer stages.

10. The demodulator circuit according to claim 1, wherein the absolute bandwidth of operation of said demodulator circuit is reduced thereby reducing power consumption.

11. The demodulator circuit according to claim 1, wherein the power consumption of said oscillator remains the same regardless of the data rate of input signal thereby enabling the locking to and subsequent demodulation of low and high data rate signals.

12. The demodulator circuit according to claim 1, further comprising a buffer operative to provide low pass filtering to the output of said mixer.

13. The demodulator circuit according to claim 1, wherein said injection-locked ring oscillator is adapted to operate effectively as an adaptive filter.

14. An FM demodulator circuit for demodulating a wideband FM signal with a high fractional bandwidth, comprising:
    an n-stage frequency dividing injection-locked ring oscillator operative to receive a wideband input signal, provide division of frequency deviation thereof and generate quadrature-phased outputs therefrom, wherein n is an integer greater than one; and
    an autocorrelation mixer operative to perform phase correlation of the quadrature-phased output of said ring oscillator and to generate a demodulated output signal therefrom.

15. The demodulator circuit according to claim 14, wherein n equals four resulting in a four stage divide by four ring oscillator operative to divide FM deviation by four.

16. The demodulator circuit according to claim 14, wherein said ring oscillator generates differential quadrature outputs.

17. The demodulator circuit according to claim 14, further comprising a buffer coupled to the output of said mixer.

18. The demodulator circuit according to claim 17, wherein said buffer provides low pass filtering to the output of said mixer.

19. An FM demodulator circuit for demodulating a wideband FM signal with a high fractional bandwidth, comprising:
   an injection-locked ring oscillator operative to receive a wideband input signal and generate quadrature-phased outputs therefrom;
   a first autocorrelation mixer operative to perform autocorrelation demodulation of the quadrature-phased output of said ring oscillator and to generate a first intermediate demodulated signal therefrom;
   a first gain stage operative to amplify and filter said first intermediate demodulated signal;
   a second autocorrelation mixer operative to perform autocorrelation demodulation of the output of said first gain stage to generate a second intermediate demodulated output signal therefrom; and
   a second gain stage operative to amplify and filter said second intermediate demodulated output signal to generate a demodulated output signal therefrom.

20. The demodulator circuit according to claim 19, wherein the power consumption of said oscillator remains the same regardless of the data rate of input signal thereby enabling the locking to and subsequent demodulation of low and high data rate signals.

21. The demodulator circuit according to claim 19, wherein the power consumption of said ring oscillator remains substantially the same regardless of the data rate of the input FM signal thereby enabling the locking to and subsequent demodulation of low and high data rate input signals.

22. A method of FM demodulation, the method comprising:
   injection-locking a ring oscillator adapted to receive a wideband input FM signal to provide division of frequency deviation thereof and generate quadrature-phased outputs therefrom; and
   performing phase correlation of the quadrature-phased output of said ring oscillator and generating a demodulated output signal therefrom.

23. The method according to claim 22, wherein said ring oscillator comprises n stages resulting in an n stage divide by n ring oscillator operative to divide FM deviation by n.

24. The method according to claim 22, wherein said ring oscillator generates differential quadrature outputs.

25. The method according to claim 22, wherein the power consumption of said ring oscillator remains substantially the same regardless of the data rate of the input FM signal thereby enabling the locking to and subsequent demodulation of low and high data rate input signals.

26. The method according to claim 22, further comprising buffering the signal output of said mixer.

27. An RF receiver, comprising:
   a low noise amplifier operative to receive a signal from an antenna coupled thereto;
   a first mixer operative to generate an IF signal based on a received signal and a local oscillator signal;
   an IF filter operative to filter said IF signal;
   an IF amplifier operative to amplify said filtered IF signal; and
   an FM demodulator circuit for demodulating a wideband FM signal with a high fractional bandwidth, comprising:
      an injection-locked ring oscillator operative to receive said amplified IF signal, provide division of frequency deviation thereof and generate quadrature-phased outputs therefrom; and
      a second mixer configured to perform autocorrelation of the quadrature-phased output of said ring oscillator and to generate a demodulated output signal therefrom.

28. The RF receiver according to claim 27, wherein said ring oscillator comprises a four stage divide by four ring oscillator operative to divide FM deviation by four.

29. The RF receiver according to claim 27, wherein said ring oscillator generates differential quadrature outputs.

30. The RF receiver according to claim 27, further comprising a buffer coupled to the output of said mixer.

31. The RF receiver according to claim 27, wherein the power consumption of said oscillator remains the same regardless of the data rate of input signal thereby enabling the locking to and subsequent demodulation of low and high data rate signals.

32. The demodulator circuit according to claim 14, wherein the modulating signal of the FM input remains substantially unaltered while the operating bandwidth is reduced by a factor of n.

* * * * *